(12) United States Patent
Mastro et al.

(10) Patent No.: US 8,237,152 B2
(45) Date of Patent: Aug. 7, 2012

(54) WHITE LIGHT EMITTING DEVICE BASED ON POLARITON LASER

(75) Inventors: Michael A. Mastro, Fairfax, VA (US); Charles R. Eddy, Jr., Columbia, MD (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 661 days.

(21) Appl. No.: 12/476,691

(22) Filed: Jun. 2, 2009

(65) Prior Publication Data
US 2010/0303468 A1 Dec. 2, 2010

(51) Int. Cl.
*H01L 29/06* (2006.01)
(52) U.S. Cl. ............... 257/14; 257/25; 372/92; 372/98
(58) Field of Classification Search .............. 372/23; 257/14
See application file for complete search history.

(56) References Cited

U.S. PATENT DOCUMENTS

| | | | |
|---|---|---|---|
| 5,877,509 A | 3/1999 | Pau et al. | |
| 6,600,175 B1 | 7/2003 | Baretz et al. | |
| 2004/0227142 A1* | 11/2004 | Izumiya | 257/79 |
| 2005/0006659 A1* | 1/2005 | Ng et al. | 257/99 |
| 2005/0195873 A1 | 9/2005 | Forrest et al. | |
| 2007/0003697 A1* | 1/2007 | Carlin et al. | 427/248.1 |
| 2008/0128745 A1 | 6/2008 | Mastro et al. | |
| 2008/0157665 A1* | 7/2008 | Wu et al. | 313/506 |
| 2008/0164489 A1* | 7/2008 | Schmidt et al. | 257/102 |
| 2009/0072751 A1* | 3/2009 | Tischler et al. | 315/169.3 |
| 2009/0212278 A1* | 8/2009 | Jorgenson et al. | 257/13 |

OTHER PUBLICATIONS

N. Antoine Vincent, "Observation of Rabi splitting in a bulk GaN microcavity grown on silicon," Phys. Rev. B, 68, 153313 (2003).
G. Weihs et al., "Exciton polariton lasing in a microcavity," Semicond. Sci. Tech. S386, 18 (2003).
P. A. Shields et al., "Magneto photoluminescence of AlGaN/GaN quantum wells," J. Cryst. Growth, 230, 487 (2001).
S. Christopoulos et al., "Room Temperature Polariton Lasing in Semiconductor Microcavities," Phys. Rev. Lett. 98, 126405 (2005).
Xu et al., "Phosphor conversion white light using InGaN ultraviolet laser diode," Appl. Phys. Lett 92, 021129 (2008).

* cited by examiner

*Primary Examiner* — Ajay K Arora
(74) *Attorney, Agent, or Firm* — Amy Ressing; Joslyn Barritt

(57) ABSTRACT

A high-efficiency white-light-emitting device that includes a polariton light emitter that emits UV or blue light to a down-converting material that converts the polariton emissions to white light. The polariton light emitter includes an active region situated within a resonant optical cavity formed on a substrate. The down-converting material can comprise a luminophoric phosphor or other material. The polariton light and down-converting material can be arranged in a single apparatus to provide a white-light-emitting device that can be used for lighting and instrumentation. The device can also be configured for high-frequency modulation to provide optical signals for communications and control systems.

27 Claims, 4 Drawing Sheets

WHITE LIGHT EMITTING DEVICE BASED ON POLARITON LASER

TECHNICAL FIELD

The present invention relates to polariton light emitters such as polariton lasers and white light-emitting devices based thereon.

BACKGROUND

In recent years there has been an increased consciousness of energy use, the result of both higher energy costs and a desire for more sustainable systems. Lighting has long been a significant user of energy, and thus there has been an effort to develop more efficient lighting systems that produce more usable light for less energy.

The most desirable light is white light, since that is considered the brightest light having the most uses for home and commercial lighting as well as for military applications such as Navy installations, ships, and components.

One approach to achieving energy efficient white lighting has involved the use of light emitting diodes (LEDs). In some cases, white-light LEDs are formed by using three separate LED dies of different colors, which when mixed together create white light, for example, an InGaN blue LED, an InGaN greed LED, and an AlInGaP red LED. However green LEDs have a very low efficiency, which makes this an unsuitable solution from an energy-saving standpoint. In other cases, a blue or UV InGaN LED can be used, which is then down-converted to white light by use of an energy down-converting phosphor. See U.S. Pat. No. 6,600,175 to Baretz (white light emitter assembly consisting of a GaN light-emitting diode with a down-converting phosphor).

An important metric for a white light source is its luminous efficacy, which is measured in lumens per watt. Current production white LEDs have an efficacy of 60-70 lm $W^{-1}$, which is greater than the high efficacy incandescent lamps (17 lm $W^{-1}$) but only comparable to the efficacy of less-expensive compact fluorescent lamps (approximately 60 lm $W^{-1}$) and linear fluorescent lamps (approximately 80 lm $W^{-1}$).

Another approach to creating a white light source has been to substitute a GaN-based laser diode as the excitation source since once a drive current in a laser diode reaches a turn-on threshold, the light output increases linearly with drive current. See Xu et al., "Phosphor-conversion white light using InGaN ultraviolet laser diode," Appl. Phys. Lett 92, 021129 (2008).

The efficiency and efficacy of traditional GaN-based LEDs and laser diodes are limited by the inherent physics of such devices. For example, like other lasers, laser diodes have a high current turn-on threshold to achieve the population inversion required for laser operation, and their high cost and low efficiency limits their desirability as a lighting solution. Although LEDs do not require the population inversion needed for laser diodes, the luminous efficacy of semiconductor LEDs is limited by the saturation of output power with increasing operating current from self-heating.

Thus, white-light LEDs and laser diodes cannot cost-effectively replace incandescent or fluorescent light sources until there is a significant decrease in their cost per lumen.

Polariton-based devices have been developed in recent years as another type of light-emitting device. See U.S. Pat. No. 5,877,509 to Pau et al. (describing a quantum well exciton-polariton light-emitting device).

A polariton is a hybrid quasi-particle consisting of both an exciton and a photon. The creation of a polariton requires strong coupling between a photon and exciton at the same energy. An exciton is a bound electron hole pair whose Coulombic interaction serves as the binding energy which is formed by optically and electrically pumping a semiconductor layer. In semiconductor optoelectronic devices, electrical bias applied to a pn junction to inject holes from the p-type layer and electrons from the n-type layer to the interface. Commonly, a quantum well or wells is designed at this interface to trap and thus increase the concentration of injection electrons, holes and excitons.

Gallium nitride (GaN) is often used as a material for such polariton devices because it has a large exciton binding energy (bulk=30 meV) that inhibits the dissociation of polaritons at room temperature and at high exciton densities. See N. Antoine-Vincent, "Observation of Rabi splitting in a bulk GaN microcavity grown on silicon," Phys. Rev. B, 68, 153313 (2003). In general, a quantum well increases the intersection of the electron and hole wavefunctions, with the binding energy of the exciton, with energies of 50 meV reported for a GaN quantum well. See G. Weihs et al., "Exciton-polariton lasing in a microcavity," Semicond. Sci. Tech. S386, 18 (2003); and P. A. Shields et al., "Magneto-photoluminescence of AlGaN/GaN quantum wells," J. Cryst. Growth, 230, 487 (2001).

A resonant cavity photon mode is established by placing the quantum well at the anti-node of an optical cavity formed by a top and bottom mirror each typically composed of a semiconductor distributed Bragg refractor (DBR) or a dielectric DBR. A strong coupling condition is established when the optical resonance energy of the cavity is matched to the recombination energy of the exciton in the bound state. Under this condition, neither distinct photons nor excitons exist, rather an exciton-polariton hybrid particle with a lifetime less than the energy relaxation time for leakage of photons from the cavity. If the polariton has time to condense before it relaxes, then it is possible at low injection to emit a relatively intense coherent beam of light through the less reflective mirror, and this spontaneous emission of coherent light from exciton-polariton condensate creates a polariton laser. See S. Christopoulos et al., "Room-Temperature Polariton Lasing in Semiconductor Microcavities," Phys. Rev. Lett. 98, 126405 (2005). The bound exciton associated with the polariton has a very short lifetime, and this short lifetime allows for very fast modulation of the light emission.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention comprises a high-efficiency white-light-emitting device that includes a polariton emitter capable of producing an intense UV or blue light at relatively low injection levels and a down-converting material that converts the polariton emissions to white light. The polariton emitter includes an active region situated within a resonant optical cavity formed on a substrate. The active region can comprise a GaN, AlGAN or InGaN-based multiquantum well or a microcavity comprising a semiconductor or organic material. The optical cavity can be formed by two opposing reflective surfaces, for example, a bottom semiconductor-based distributed Bragg refractor (DBR) and a top dielectric-based DBR.

The substrate on which the optical cavity is fabricated can be an r-plane sapphire or other suitable material. The down-converting material can comprise a luminophoric phosphor or other material. The polariton laser and down-converting material can be arranged in a single apparatus to provide a white-light-emitting device that can be used for lighting and instrumentation and that also has a high-frequency modulation enabling its use in communications and control systems.

DETAILED DESCRIPTION

Figure 1:
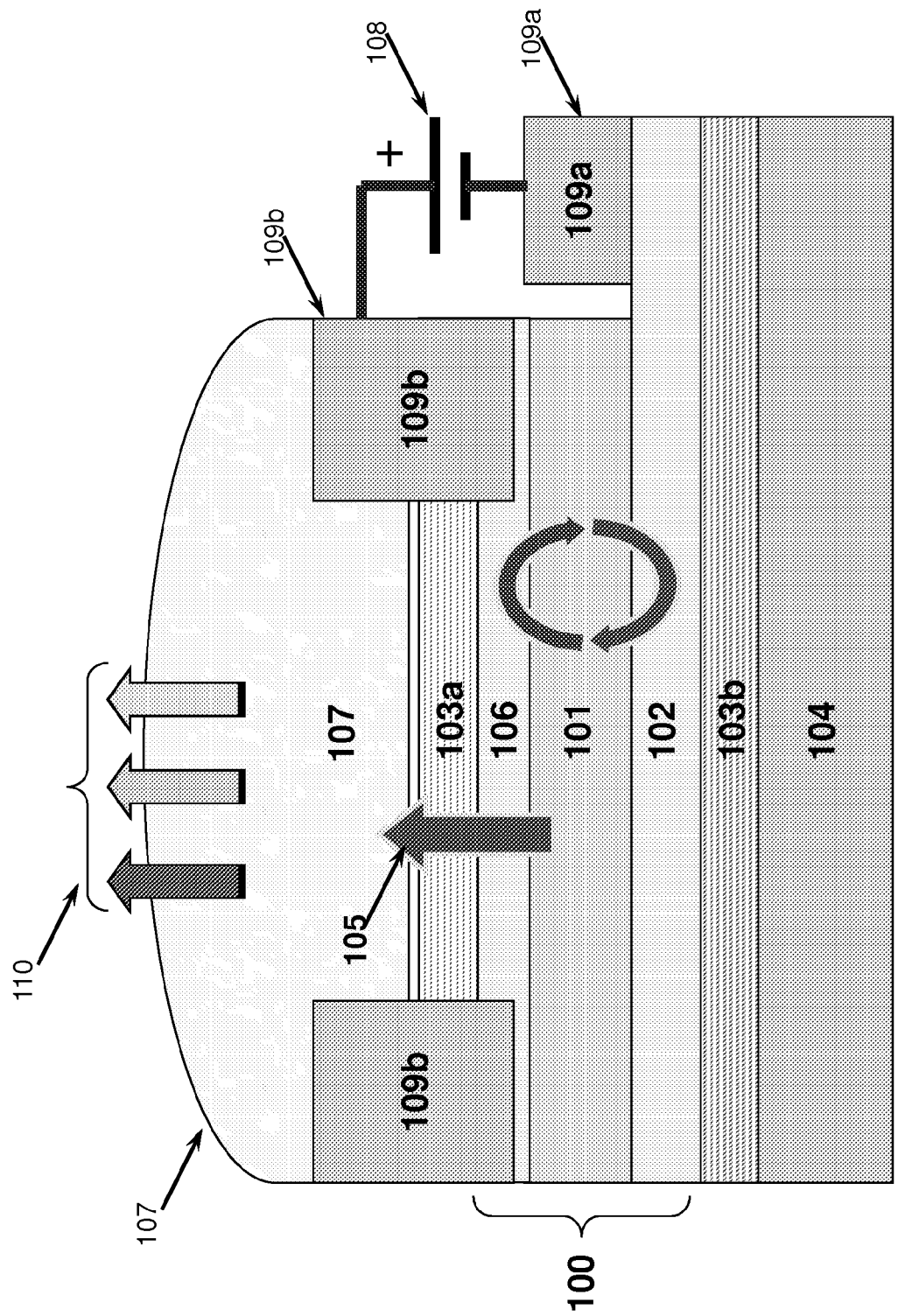
FIG. 1 is a block diagram depicting an exemplary embodiment of a white light-emitting device in accordance with the present invention.

The invention summarized above can be embodied in various forms. The following description shows, by way of illustration, combinations and configurations in which the aspects can be practiced. It is understood that the described aspects and/or embodiments of the invention are merely examples. It is also understood that one skilled in the art may utilize other aspects and/or embodiments or make structural and functional modifications without departing from the scope of the present disclosure.

For example, in the description below, the polariton light emitter often will be described as a polariton laser, but it will be appreciated by one skilled in the art that the principles and structures described herein apply equally to a more generalized polariton-emitting device that emits light that is less coherent than the fully coherent light emitted by a polariton laser. As another example, the sequential deposition process for formation of the polariton light emitter described herein can be replaced by wafer bonding or other parallel processes that result in a similar final device structure.

The present invention provides a white-light-emitting device comprising a UV or blue light-emitting polariton emitter and a down-converting luminophoric medium such as a phosphor, both arranged in a single assembly. The luminophoric medium can include a phosphorescent material, a fluorescent material, or one or more semiconductor quantum dots. The white light emitted from a device in accordance with the present invention can be produced solely from the phosphoric or similar material or can be a mixture of the polariton emitted light with light from the phosphoric material.

As noted above, a polariton emitter can also emit highly coherent light, thus acting as a polariton laser, making it suitable for interferometry, holography, and use in optical sensors such as fiber-optic sensors. Unlike a conventional diode laser, however, a polariton laser requires no inversion and can emit high-intensity light at low drive currents, thus allowing much faster turn-on times with significantly less energy needed for operation than conventional laser-based light. In addition, polaritons have a very short lifetime; this short lifetime combined with the lack of a turn-on time for inversion, allows for very fast modulation of the light emission. This high speed modulation of the light emitted from a device in accordance with the present invention can enable the use of the device in communications between two or more objects.

A polariton white-light-emitting device in accordance with the present invention can be placed within a housing or other module configured to provide electrical or optical stimulation to the device in either a continuous or modulated manner. Some embodiments of a device in accordance with the present invention can be configured as a single assembly comprising an electrically injected cavity polariton laser combined with the luminophoric medium, while in other embodiments, the device can be configured as a single assembly that can include a passive cavity polariton laser and luminophoric medium combined with either an electrically injected light emitting diode or a laser diode.

As described in more detail below, a polariton emitter for use in the present invention can include an active region comprising one or more polariton light emitting layers embedded in an optical cavity. The active region can comprise a microcavity having a specified width or a semiconductor heterostructure comprising one or more quantum wells. The optical cavity can be formed by two mirrors comprising a semiconductor distributed Bragg refractor DBR, a dielectric DBR, or a thin reflective metallic layer. In some such embodiments, the mirrors can be placed above and below the light-emitting layers in a microcavity while in other embodiments they can be placed above and below a light-emitting quantum well at an antinode of the microcavity. In addition, in some embodiments, current can flow from ohmic n- and p-contacts to the active region through one or both mirror layers by use of a conductive mirror layer such as an n-type or p-type semiconductor-based DBR. In other embodiments, current can flow directly from the contacts to the active region without flowing through the mirror layer. In such a case, current flow through the mirror layer can be avoided by, for example, etching through the mirror layer and subsequently depositing the contact layer in this opening. This design allows placement of the mirrors close to the active region and avoids the need for use of semiconductor distributed Bragg mirrors, which have a penetration length that effectively increases the optical length of the cavity formed with this mirror. Furthermore, p-type DBRs based on the AlInGaN alloy have low conductivity due to the high activation energy of the most common p-type dopant, Mg.

FIG. 1 is a block diagram depicting an exemplary general structure of a polariton laser-based white light-emitting device in accordance with the present invention. These elements and their operation will be described in more detail below.

The exemplary embodiment shown in FIG. 1 includes a polariton laser comprising a polariton light emitting structure having an active region comprising gain cavity 101 and n-contact layer 102 which is embedded in a resonant optical cavity 100 formed by a reflective material such as —$SiO_2$/$Si_3N_4$ dielectric mirror 103a and n-type DBR mirror 103b surrounding the optical cavity and disposed on a substrate such as r-plane sapphire 104. The polariton light emitting structure emits UV or blue light 105 having a wavelength of about 360 to about 500 nm in a direction perpendicular to the active region. This emitted light travels through p-contact layer 106 to down-conversion material 107, where the UV or blue light is converted to a two- or three-color blend 110 to produce white light.

The exemplary structure shown in FIG. 1 further includes a voltage source 108 which is connected to n-contact 109a and p-contact 109b to inject electrons and holes into the semiconductor material. As described above, current from the ohmic p-contact and the ohmic n-contact can flow through conductive DBRs composed of an appropriate Si doped or Mg doped alloys of AlInGaN. Alternatively, the contacts can be placed closer to the active region to allow the use of dielectric or metal mirrors.

In some embodiments, gain cavity 101 can comprise a semiconductor heterostructure comprising GaN/AlGaN/InGaN/InAlGaN, ZnO/MgZnO, ZnSe/ZnMgSe, CdTe/CdMnTe or similar alloys which create a multiquantum well. In an exemplary embodiment, the quantum well is placed at the anti-node of resonant optical cavity 100. In alternative embodiments, gain cavity 101 can comprise a microcavity having a preferable thickness of $n\lambda/2$, where n is a positive integer and $\lambda$ is the wavelength of the light within the semiconductor, which is the vacuum wavelength divided by the index of refraction of the semiconductor. In some such alternative embodiments, the microcavity can comprise GaN or other inorganic semiconductor having a high exciton binding energy, such as AlGaN, InGaN, InAlGaN, ZnO, MgZnO, ZnSe, ZnMgSe, CdTe, and CdMnTe, while in other designs the microcavity can comprise one or more organic materials selected from pseudoisocyanine, cyanine dyes, transition metal porpyhrins, a-conjugated polysilanes, and polyaromatic cyclic anhydrides.

A polariton can generate a photon from the active region of a polariton laser in the form of light, just as photons are emitted from the active region in a conventional diode laser or from an LED. However, the production of a photon from a polariton laser is very different from the production of a photon from a conventional laser or LED. The stimulated emission in a conventional laser needs a huge gain needed to overcome loss and thus initiate lasing, which requires use of high-reflectance mirrors and a large injection of energy. Conventional light-emitting diodes and laser diodes create light via band-to-band, ionized impurity-to-band, or similar recombination mechanisms and do not require such high energy, but are very inefficient in producing a directional light output. In a polariton laser, excitons comprising bound electron-hole pairs are created in gain cavity 101, for example, by an injection of electrons and holes from voltage source 108 connected to n-contact 107a and p-contact 107b. As noted above, gain cavity 101 is embedded in a resonant optical cavity 100 formed by the surrounding reflective materials 103a and 103b. The resonant energy of the optical microcavity is matched to the exciton recombination energy. This strong coupling creates a rapid indistinguishable cycling between the photon and exciton states that creates a hybrid exciton-polariton particle. This excited polariton relaxes quickly as a Bose condensate in the ground state, i.e., stimulated scattering into the lowest polariton state. This condensate transfers its energy to a photon emitted in a direction perpendicular to the least reflective top cavity mirror. The advantage of polariton laser is that the polariton state fills quickly so low levels of injection lead directly to lasing. Because the polariton lasing states do not require a population inversion, pumping thresholds can be much lower and are no longer related to the volume of the laser. If a very large bias were applied to a polariton laser, the resulting increase in carrier density would prevent formation of the polariton state, but weak coupling would still allow standard photon lasing to take place if the gain exceeded the loss.

The semiconductor material gallium nitride (GaN) has a high exciton binding energy, especially at room temperature, and therefore is a particularly useful material for use in gain cavity 101, either alone or in alloys such as aluminum gallium nitride (AlGaN) or indium gallium nitride (InGaN). However, polar GaN suffers from a large polarization charge perpendicular to the quantum well, which can separate the electron and hole wavefunctions and reduce the binding energy, with the result that the excitons can decay before combining with the photons to create the polaritons. Consequently, it is preferred to use GaN quantum wells in a non-polar orientation. Such non-polar GaN can be formed on substrate 104 by means such as metalorganic chemical vapor deposition (MOCVD), molecular beam epitaxy (MBE), hydride vapor phase epitaxy (HVPE), pulsed laser deposition (PLD), atomic layer deposition (ALD) and variants thereof. If non-polar GaN is used, substrate 104 can comprise a commercial r-plane sapphire, (100) lithium aluminate, or an a- or m-plane bulk GaN substrate. Alternatively, although not preferred, polar GaN can be used for gain cavity 101, and if so used, can be produced by deposition on a- or c-plane sapphire, a silicon (Si) (111 or 100) wafer, a (0001) 4H- or 6H-silicon carbide (SiC) or other appropriate substrate.

As described above, gain cavity 101 can comprise solely a GaN $n\lambda/2$ microcavity or can include a GaN-based multiquantum well embedded in an optical cavity 100 formed by top and bottom mirrors 103a and 103b. In an exemplary embodiment, top and bottom mirrors 103a/103b are formed with alternating AlGaN-based layers to form a semiconductor distributed Bragg refractor (DBR). In such an embodiment, top mirror 103a can be formed from a p-type AlN/AlGaN semiconductor, with bottom mirror 103b being formed from an n-type AlN/AlGaN semiconductor. In other embodiments, top and bottom mirrors 103a/103b can be formed by a dielectric DBR or a metallic or semi-metallic layer. Regardless of the material used, the mirror material should be selected for high reflectance and low absorbance. In addition, the mirror closest to the down-converting material, typically mirror 103a, should be less reflective so that the polaritons can transfer their energy to photons emitted out of the less reflective mirror which travel towards the down-converting material for down-conversion and eventual emission as white light.

The energy of the coupled exciton, resonant photon, polariton, and emitted photon will depend on the thicknesses of the layers of semiconductor material used. The composition and thickness of the quantum well structure or the microcavity determines the energy of the exciton; similarly, the thickness and composition of the cavity structure and mirrors define the resonant photon energy. The polariton state can only be established when the energies of the exciton, the resonant photon, and the polariton are matched. This resonant energy determines the energy and thus the wavelength of the photon emitted from the polariton laser in accordance with the conventional relation $\lambda = hc/E$, where $\lambda$ is the wavelength, h is Planck's constant, c is the speed of light, and E is the energy of the emitted photon.

Thus, in accordance with the present invention, the composition and thickness of the semiconductor materials comprising the polariton laser can be chosen to generate a polariton emission having a desired wavelength. In general, the polariton light emitter produces light in the UV or blue part of the spectrum. The particular UV or blue wavelength of the polariton laser emission, and thus the specific structure of the polariton laser, can be selected based on the absorption characteristics of the down-converting material used. The UV or blue light strikes the down-converting material, e.g., a phosphor compound deposited in the package, and upon illumination by the light from the polariton laser, the phosphor absorbs the energy from the incident photons from the polariton emitter and fluoresces across the blue to the red part of the spectrum.

The particular phosphor compound can also be chosen to affect the output light. In some embodiments, the phosphor can be opaque such that all of the incident light from the polariton emitter is absorbed and the only light output from the device is emitted from the phosphor, whereas in other embodiments, the phosphor can be semitransparent so that the combination of the blue light that goes through the phosphor and the light emitted by the phosphor produce a net emission of white light. For example, divalent europium ($Sr_{10}(PO_4)_6Cl_2$:$Eu^{2+}$) strongly absorbs near UV light and emits in the blue and cerium(III)-doped YAG ($Y_3Al_5O_{12}$:$Ce^{3+}$) absorbs in the blue and emits in the yellow. A mixture of these two materials will create white light when they are stimulated with UV light with a peak absorbance of the phosphor blend near 360 nm. See Xu et al., supra. Other energy down-conversion materials can be substituted by any material with an emission across the visible spectrum including fluorescent glasses, rare-earth doped borates, rare-earth doped $LaF_3$, cadmium selenide nanocrystals or other similar materials or a blend of any of these materials.

Thus, the emitted white light can be solely from the phosphoric or similar material, or can be a mixture of the polariton emitted light with light from the phosphoric material. The polariton emitting layer can also be shaped as one or more dots or one or more wires, making a polariton-laser based white light emitter in accordance with the present invention a very versatile source of lighting.

In addition, in contrast to conventional semiconductor lasers which are designed as edge emitters and emit light in a direction parallel to the layers in the active gain region, as shown in FIG. 1 and as described above, a polariton laser can emit light 105 in a direction perpendicular to the layers in the active gain region. The general down-conversion mechanism from photons generated from a polariton based light emitter is the same from photons emitted from light emitting diode; however, the directional nature of photon emission from a polariton in a cavity can more efficiently direct photons into the down-converting material. This permits the use of multiple parallel polariton emitting devices that can feed UV or blue light to the down-converting luminophoric material in the same assembly. Because the polariton emissions are perpendicular to the gain region, the polariton emissions do not interfere with emissions from other devices such as conventional semiconductor LEDs or laser diodes that may be placed alongside the polariton laser structure in the same assembly. In such embodiments, any one or more of the polariton lasers, LEDs, or laser diodes in the assembly can stimulate the luminophoric medium, and the light emitted from the assembly can be tuned as desired by selecting an appropriate combination of devices and emissions.

Also, in some embodiments, a polariton light-emitting device in accordance with the present invention can comprise a passive device that is not connected to a voltage source but that instead is combined with an electrically injected LED or laser diode in the same assembly, with the LED or laser diode providing optical rather than electrical stimulation for the creation of polaritons by the polariton laser. This is similar conceptually to conventional diode-pumped solid-state lasers, which are made by pumping a solid gain medium, for example, a ruby or a neodymium-doped YAG crystal, with a laser diode, although as described above, the operation of a polariton laser is very different from that of a conventional laser. Creating the polariton state by optical stimulation rather than electrical stimulation removes the need to inject current from the contacts and so can provide great flexibility in design of any particular assembly.

Thus, a polariton laser assembly in accordance with the present invention can be fabricated into many different configurations, depending on its use. Such assemblies can serve as white light source in industrial and commercial applications such as automobile headlights, general indoor or outdoor lighting, and lighting for liquid crystal displays or similar backlight devices.

Figure 2A:
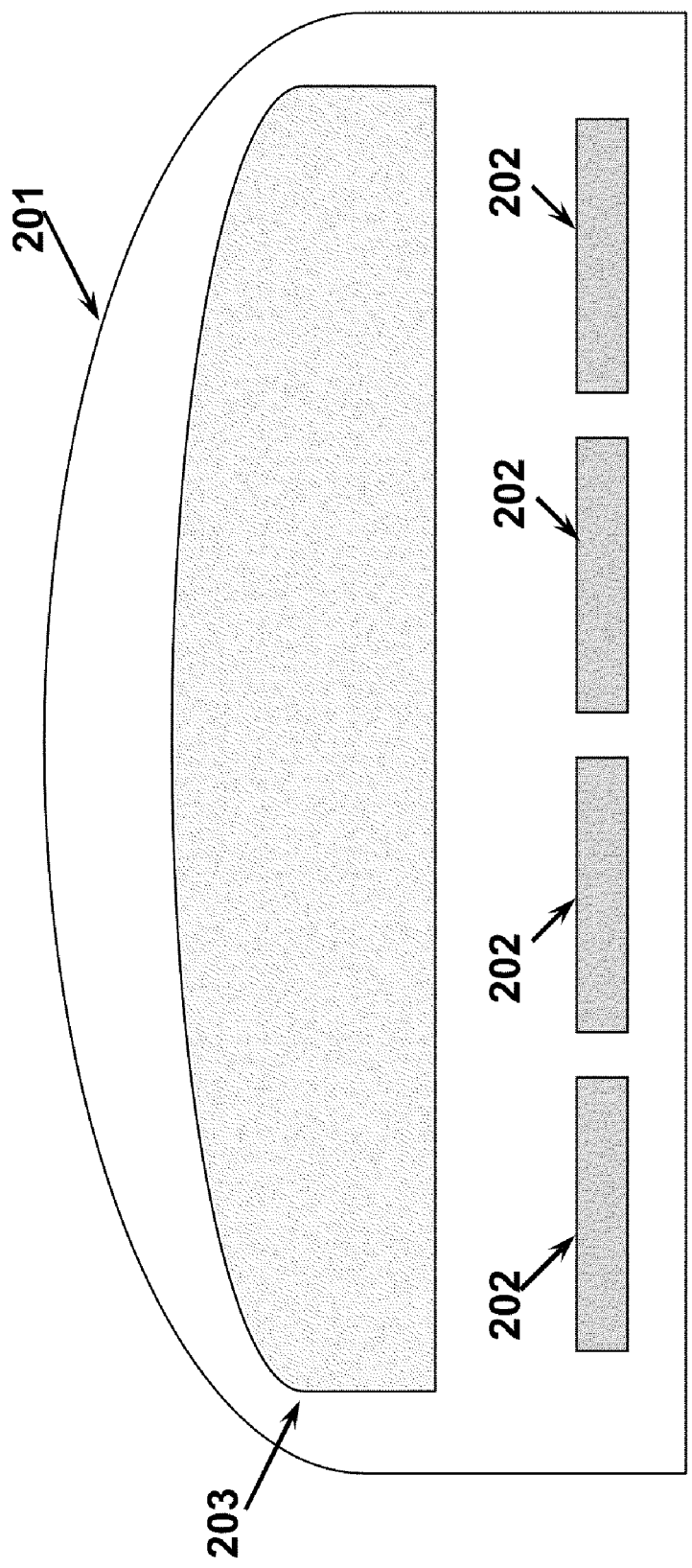
FIGS. 2A and 2B are block diagrams depicting additional exemplary embodiments of a white light-emitting device in accordance with the present invention.

FIG. 2A depicts an exemplary embodiment of such a multi-polariton device assembly.

Figure 2B:
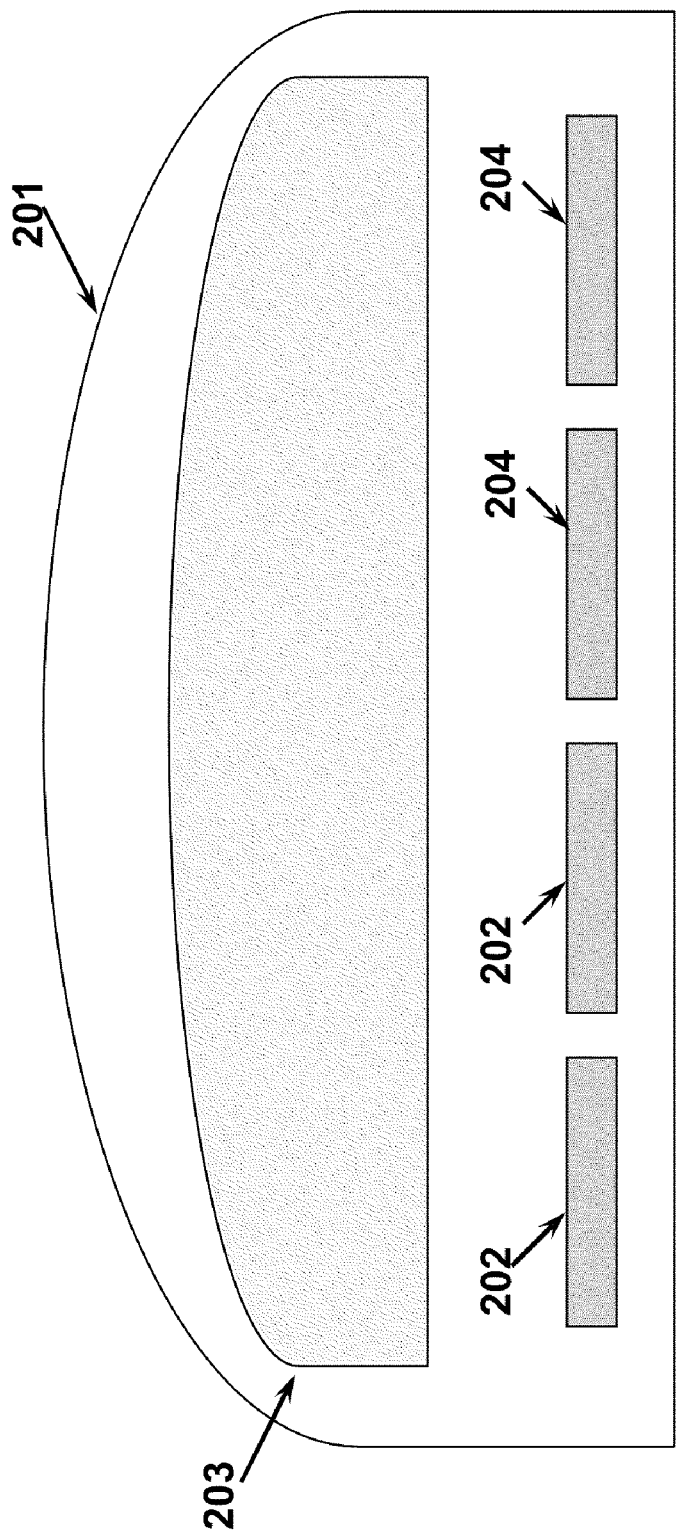

Thus, as shown in FIG. 2, a polariton white-light emitting assembly in accordance with the present invention can include a housing 201 containing one or more polariton laser devices 202, with a luminophoric material such as a phosphor layer 203 as described above situated in close proximity to the polariton laser devices 202. In addition, as noted above in some embodiments, one or more LEDs or laser diodes can also be placed in the housing along with the polariton devices, with the number and configuration of the different kinds of devices varying depending on the application and/or the user's desires. FIG. 2B shows an exemplary embodiment of such a design, with housing 201 holding two polariton laser devices 202 and two LEDs 204. In accordance with the present invention, phosphor layer 203 can cover only the polariton laser devices 202, only the LEDs 204, or both the LEDs 204 and the polariton laser devices 202, depending on the desired configuration. A common metric in white lighting devices including those based on LEDs is the correlated color temperature (CCT) and color rendering index (CRI). Essentially the CCT and CRI describe the peak light intensity as well as its distribution across the visible spectrum. Although a blue and yellow light will "sum" to white light, this spectrum is displeasing to the human eye. Thus, in some embodiments of a combined assembly in accordance with the present invention, the LEDs are not covered by the phosphor; instead appropriately colored LEDs can be used to fill in the spectrum to improve the CCT and CRI metrics.

As noted above, a polariton laser-based white-light-emitting device can have a wide range of applications, including use in household, commercial, and industrial lighting, backlighting for displays, and lighting for instrumentation. In addition, as described above, the lack of turn-on time for inversion and the very short lifetime of the polariton allows for very fast modulation of the light emission. This high-speed modulation of the light emitted from a polariton laser-based device in accordance with the present invention can enable the use of the device in communications and control between two or more objects.

Figure 3:
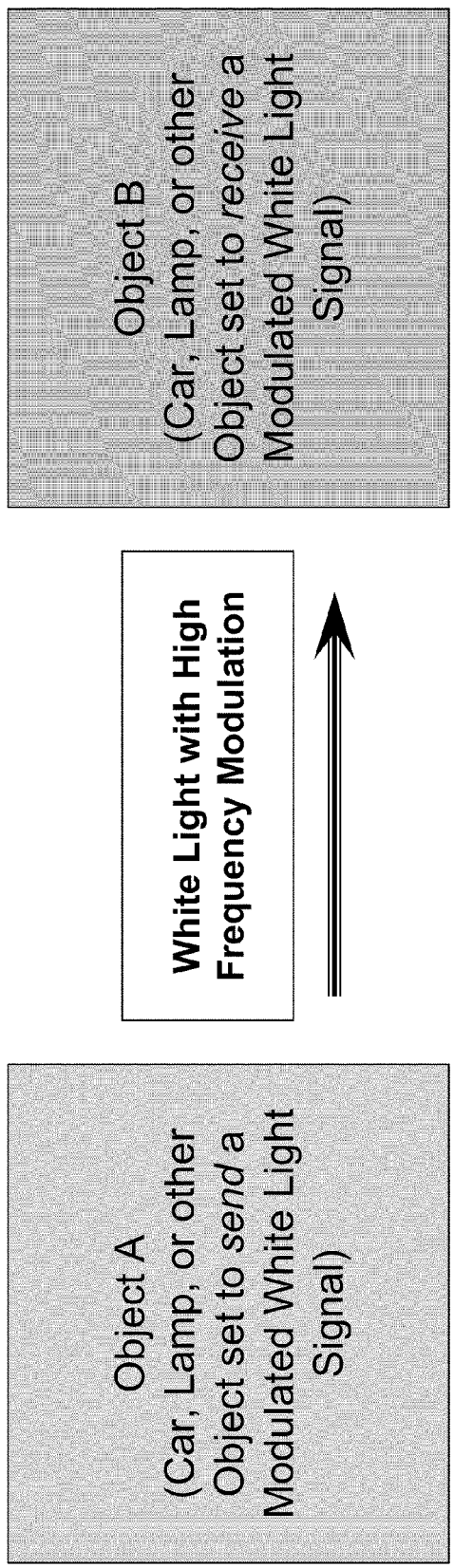
FIG. 3 is a block diagram depicting aspects of an exemplary application of a white light-emitting device in accordance with the present invention.

FIG. 3 depicts aspects of an exemplary embodiment of such a use of a device in accordance with the present invention. In this exemplary embodiment, the white-light-emitting device can be used to send high-speed modulated signals for communication between two objects, such as two cars. The modulation rate can be set at a level that cannot be distinguished by the human eye but that can be distinguished by an appropriate receiver in the second car. Thus, as shown in FIG. 3A, a first object A such as a first car, can send a modulated signal to a second object B, e.g., a second car, using a high-frequency white light. Such a signal can communicate to the second car the location of the first car and enable the second car to automatically take steps such as braking or steering avoid a collision, steps that can be taken faster than would be possible with human reaction time. Other applications include the use of such high-speed light signals for communications between aircraft, both civilian and military, and common household appliances.

Thus, in accordance with the present invention a white-light-emitting device can be fabricated using a polariton laser coupled with a down-converting material such as a luminophoric phosphor. A white-light emitting polariton device in accordance with the present invention can emit a high-intensity white light at a very low injection current, and therefore is provides brighter light with more efficiency than current LEDs or laser diodes. In addition, the emission of light from a polariton lasers does not require a population inversion as is needed for conventional lasers and thus the light can be created almost instantly upon the application of a current or other excitation source, reducing the current needs even further. Devices in accordance with the present invention can be used as cost- and energy-efficient white light sources in numerous military, civilian, industrial, commercial, and home applications.

Although particular embodiments, aspects, and features have been described and illustrated, it should be noted that the invention described herein is not limited to only those embodiments, aspects, and features. It should be readily appreciated that these and other modifications may be made by persons skilled in the art, and the present application contemplates any and all modifications within the spirit and scope of the underlying invention described and claimed herein.

What is claimed is:

1. A white light-emitting device, comprising:
   a polariton light emitter disposed within an optical cavity, the optical cavity having a resonant mode corresponding to a predetermined resonant photon energy, the polariton light emitter comprising an active region forming a plurality of polaritons therein, each of the plurality of polaritons comprising an exciton coupled with a resonant photon, an energy of each of the plurality of polaritons being determined by an energy of the exciton and an energy of the resonant photon coupled therewith; and
   a down-converting medium disposed in close proximity to the optical cavity;
   wherein the polariton light emitter emits light having a wavelength corresponding to the energy of the polaritons formed in the active region, the emitted light being received by the down-converting medium; and
   wherein the down-converting medium converts the received light from the polariton light emitter to white light, the white light being then emitted by the down-converting medium.

2. The white light-emitting device according to claim 1, wherein optical cavity comprises a first reflector and a second reflector, the second reflector being less reflective than the first reflector,
   the light emitted from the polariton light emitter traveling through the second reflector before being received by the down-converting medium.

3. The white light-emitting device according to claim 2, wherein the first and second reflectors comprise semiconductor distributed Bragg refractor (DBR) mirrors.

4. The white light-emitting device according to claim 3, wherein the first reflector comprises an n-AlN/AlGaN DBR mirror and the second reflector comprises p-AlN/AlGaN DBR mirror.

5. The white light-emitting device according to claim 2, wherein the first and second reflectors comprise dielectric distributed Bragg refractor (DBR) mirrors.

6. The white light-emitting device according to claim 1, wherein the active region in the polariton light emitter comprises a multiquantum well.

7. The white light-emitting device according to claim 6, wherein the multiquantum well is formed by a semiconductor material comprising one of gallium nitride (GaN), aluminum gallium nitride (AlGaN), and indium gallium nitride (InGaN).

8. The white light-emitting device according to claim 7, wherein the GaN used in the semiconductor material is nonpolar GaN.

9. The white light-emitting device according to claim 8, wherein the multiquantum well is formed on a substrate comprising one of an r-plane sapphire, a (100) lithium aluminate, an a-plane bulk GaN, and an m-plane bulk GaN.

10. The white light-emitting device according to claim 7, wherein the GaN used in the semiconductor material is polar GaN.

11. The white light-emitting device according to claim 10, wherein the multiquantum well is formed on a substrate comprising one of an a-plane sapphire, a c-plane sapphire, a (111) silicon (Si) wafer, a (100) Si wafer, (0001) 4H-silicon carbide (SiC), and (0001) 6H-SiC.

12. The white light-emitting device according to claim 1, wherein the active region in the polariton light emitter comprises a microcavity having a thickness of $n\lambda/2$, where n is a positive integer and $\lambda$ is a wavelength of the light within the microcavity.

13. The white light-emitting device according to claim 12, wherein the microcavity is a semiconductor microcavity and $\lambda$ is a wavelength of the light within the semiconductor.

14. The white light-emitting device according to claim 13, wherein the semiconductor comprises one of GaN, AlGaN, InGaN, InAlGaN, ZnO, MgZnO, ZnSe, ZnMgSe, CdTe, and CdMnTe.

15. The white light-emitting device according to claim 12, wherein the microcavity comprises an organic material selected from the group consisting of pseudoisocyanine, cyanine dyes, transition metal porpyhrins, a-conjugated polysilanes, and polyaromatic cyclic anhydrides.

16. The white light-emitting device according to claim 1, wherein the down-converting medium comprises a luminophoric phosphor.

17. The white light-emitting device according to claim 1, wherein the down-converting medium comprises one of a phosphorescent material, a fluorescent material, and a semiconductor material comprising at least one semiconductor quantum dot.

18. The white light-emitting device according to claim 1, wherein the down-converting medium comprises at least one luminescent material capable of producing a white light without light contribution from the polariton light emitter.

19. The white light-emitting device according to claim 18, wherein the down-converting medium is opaque and absorbs all of the light received from the polariton light emitter such that the light emitted from the white-light-emitting device comprises only light emitted from the down-converting medium.

20. The white light-emitting device according to claim 17, wherein the down-converting luminophoric medium is semitransparent such that the light emitted from the white light-emitting device comprises both light emitted from the polariton light emitter and light emitted from the down-converting medium.

21. The white light-emitting device according to claim 1, wherein the light emitted from the polariton light emitter has a wavelength from about 360 nm to about 500 nm.

22. The white light-emitting device according to claim 1, further comprising a transparent housing, wherein at least one polariton light emitter and the down-converting medium are situated within the housing; and wherein the white light is emitted through the transparent housing.

23. The white light-emitting device according to claim 1, the polariton light emitter further including an n-type semiconductor contact layer and a p-type semiconductor contact layer and a voltage source operatively connected to the optical cavity, wherein the voltage source supplies electrons to the n-type semiconductor contact layer and supplies holes to the p-type semiconductor contact layer, the electrons and holes combining as bound pairs to form the excitons.

24. The white light-emitting device according to claim 22, wherein the polariton light emitter comprises a passive cavity emitter not connected to a voltage source; and
    wherein a semiconductor light emitting diode is situated in the housing along with the passive polariton light emitter to provide a source of photons to stimulate light emission from the passive polariton light emitter.

25. The white light-emitting device according to claim 22, wherein the polariton light emitter comprises a passive cavity emitter not connected to a voltage source; and
    wherein a laser diode is situated in the housing along with the passive polariton light emitter to provide a source of photons to stimulate light emission from the passive polariton light emitter.

26. An optical communications system comprising:
    a first object configured with a polariton white light-emitting device comprising a polariton light emitter disposed within an optical cavity, the optical cavity having a resonant mode corresponding to a predetermined resonant photon energy, the polariton light emitter comprising an active region forming a plurality of polaritons therein, each of the plurality of polaritons comprising an exciton coupled with a resonant photon, an energy of each of the plurality of polaritons being determined by an energy of the exciton and an energy of the resonant photon coupled therewith, and a down-converting medium disposed in close proximity to the optical cavity, wherein the polariton light emitter emits light having a wavelength corresponding to the energy of the polaritons formed in the active region, the light from the polariton light emitter being received by the down-converting medium and converted to white light, the white light being then emitted by the down-converting medium, the polariton light emitter further being coupled to a voltage source providing a high-frequency modulation of power provided to the polariton light emitter to create a high-frequency modulation of the light emission from the white light-emitting device; and
    a second object configured to receive the high-frequency modulated light emission from the first object.

27. The optical communications system according to claim 26, the first object effects a control over the second object by means of the high-frequency modulated light emission from the first object.

* * * * *